US 6,553,089 B2

(12) United States Patent
Huh et al.

(10) Patent No.: US 6,553,089 B2
(45) Date of Patent: Apr. 22, 2003

(54) FRACTIONAL-N FREQUENCY SYNTHESIZER WITH FRACTIONAL COMPENSATION METHOD

(75) Inventors: Hyungki Huh, Kyung-Ki-Do (KR); Eunseok Song, Seoul (KR); Kang Yoon Lee, Seoul (KR); Yido Koo, Seoul (KR); Jeongwoo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/940,807

(22) Filed: Aug. 29, 2001

(65) Prior Publication Data
US 2002/0136341 A1 Sep. 26, 2002

Related U.S. Application Data
(60) Provisional application No. 60/276,927, filed on Mar. 20, 2001.

(51) Int. Cl.[7] ............................... H03D 3/24; H03L 2/06
(52) U.S. Cl. ..................... 375/376; 375/375; 327/156; 327/157
(58) Field of Search ..................... 375/371, 373, 375/374, 375, 326, 327, 376; 327/146–150, 155–159

(56) References Cited

U.S. PATENT DOCUMENTS

| 4,868,513 | A | | 9/1989 | Piercy et al. ............... 328/134 |
|---|---|---|---|---|
| 5,339,050 | A | * | 8/1994 | Llewellyn ..................... 331/16 |
| 5,347,232 | A | * | 9/1994 | Nishimichi .................. 604/158 |
| 5,774,023 | A | * | 6/1998 | Irwin .......................... 327/105 |
| 5,815,016 | A | * | 9/1998 | Erickson ...................... 327/158 |
| 5,838,205 | A | * | 11/1998 | Ferraiolo et al. ............ 327/147 |
| 5,872,520 | A | * | 2/1999 | Seifert et al. ................ 333/154 |
| 5,909,474 | A | * | 6/1999 | Yoshizawa .................... 327/156 |
| 5,942,949 | A | * | 8/1999 | Wilson et al. ................. 331/17 |
| 5,953,386 | A | * | 9/1999 | Anderson .................... 327/156 |
| 6,043,715 | A | * | 3/2000 | Bailey et al. ................... 331/2 |
| 6,084,479 | A | * | 7/2000 | Duffy et al. ................... 331/17 |
| 6,100,767 | A | * | 8/2000 | Sumi ........................... 331/11 |
| 6,114,920 | A | * | 9/2000 | Moon et al. ................. 331/179 |
| 6,388,536 | B1 | * | 5/2002 | Welland ...................... 327/107 |

* cited by examiner

Primary Examiner—Tesfaldet Bocure
(74) Attorney, Agent, or Firm—Fleshner & Kim, LLP

(57) ABSTRACT

A phase-locked loop (PLL) frequency synthesizer incorporates fractional spur compensation circuitry. This fractional spur compensation circuitry dynamically compensates charge pump ripple whenever a charge pump operates. It can utilize a programmable divider, two phase detectors each using a charge pump stage pumps. A fractional accumulator stage determines the number of charge pumps that operate during a phase comparison. The PLL frequency synthesizer avoids the need for compensation current trimming. Also, fractional compensation is accomplished dynamically and in a manner that is robust to environmental changes.

46 Claims, 14 Drawing Sheets

FRACTIONAL-N FREQUENCY SYNTHESIZER WITH FRACTIONAL COMPENSATION METHOD

BACKGROUND OF THE INVENTION

This application claims priority to U.S. Provisional Application Ser. No. 60/276,927, filed Mar. 20, 2001, whose entire disclosure is incorporated herein by reference.

1. Field of the Invention

The present apparatus and method can be used for any system that requires fractional resolution of a reference frequency, and relates, in particular, to a PLL-based frequency synthesizer for use in a modern wireless or wired communication system.

2. Background of the Related Art

Frequency synthesizers are typically used in modern wireless communication systems to produce a desired output frequency in both the receiver and transmitter. Among the various phase locked loop (PLL) based frequency synthesizers, fractional-N frequency synthesizers are suitable for the communication systems where the channel interval is small. Fractional-N architecture allows frequency resolution that is a fractional portion of a reference frequency $F_{REF}$, and an output frequency signal $F_{OUT}$ is related to the reference frequency $F_{REF}$ by the relationship $F_{OUT} = F_{REF}(N+K/F)$, where F is the fractional resolution of the device with respect to the reference frequency. The technique of fractional-N architecture requires generating a divider that is a fractional number rather than an integer. This is performed by changing the divider in the loop dynamically between the values N and N+1. If out of F cycles, division by N+1 is done K times and by N, F−K times, then the average division ratio is N+K/F.

The advantage of the fractional-N architecture is that the reference frequency $F_{REF}$ is not restricted by the channel spacing, and loop bandwidth can be increased. Therefore, phase noise and locking time is reduced. However, the switching of the divisors causes spurious signals in the synthesized output frequency signal $F_{OUT}$. These subharmonic spurs, also referred to as fractional spurs, must be kept below some maximum acceptable limit.

FIG. 1 shows a schematic diagram of a related art fractional compensation circuit 100, that attempts to reduce unwanted spurious signals. As shown in FIG. 1, a reference frequency ($F_{REF}$) 102, is fed into a reference frequency divider 104, and an output 106, of the reference frequency divider 104, is fed into a phase detector 110. The terms "phase detector" and "PD" refer to the same type of circuit and are used interchangeably herein. "PD1" and "PD2" are sometimes used where more than phase detector circuit is referenced. The phase detector 110, also receives an output 108, of a modulus divider 132. An output 112, of the phase detector 110, is fed into an adder 118. A digital to analog converter (DAC) 114, feeds a compensation current 116 that is proportional to the fractional error phase into the adder 118. An output 120 of the adder 118 is fed into a loop filter 122, and an output 124 of the loop filter 122 is fed into a voltage controlled oscillator 126. The terms "voltage controlled oscillator" and VCO refer to the same type of circuit and are used interchangeably herein. The output of the voltage controlled oscillator 126 is an $F_{OUT}$ output 128 of the fractional compensation circuit 100, and an input to the modulus divider 132. An accumulator 134, has a first output 136, fed into the modulus divider 132 and a second output 138, fed into the digital to analog converter 114. For proper fractional compensation, the area of the compensation pulse must be equal to the area of the main charge pump fractional-N ripple. In the related art fractional compensation circuit 100, however, the amount of the compensation current 116 is statically fixed. Therefore, the spurious signal cancellation cannot track the dynamic change of the spurious signals with time, process, and temperature.

FIG. 2 is a schematic diagram of another related art fractional compensation circuit 200, typically known as a fractional-N synthesizer, which controls the dividing ratio by using a sigma-delta (ΣΔ) modulator. As shown in FIG. 2, a reference frequency 202, is fed into a reference frequency divider 204, and an output 206 of the reference frequency divider 204 is fed into a phase detector 210. An output 212 of the phase detector 210 is fed into a loop filter 214, and an output 216 of the loop filter 214 is fed into a voltage controlled oscillator 218. An output 220 of the voltage controlled oscillator 218 is a frequency output ($F_{OUT}$) 220 of the fractional-N synthesizer, and is also input to a modulus divider 224. The modulus divider 224, also receives an output signal 226, from a ΣΔ modulator 228. An output 208 of the modulus divider is received by the phase detector 210. The fractional spurious frequencies or phase noise are distributed throughout the frequency spectrum by the operation of the sigma-delta modulator. However, the absolute noise level may be increased above acceptable levels. A more robust and reliable fractional compensation scheme, which does not degrade the spectral purity, is needed.

The above references are incorporated by reference herein where appropriate for appropriate teachings of additional or alternative details, features and/or technical background.

SUMMARY OF THE INVENTION

An object of the present invention is to solve at least the above problems and/or disadvantages and to provide at least the advantages described hereinafter.

Another object of the present invention is to provide a phase locked loop-based fractional-N synthesizer.

Another object of the present invention is to provide a fractional compensation circuit and method that incorporates two phase detectors.

Another object of the present invention is to incorporate fractional spur compensation circuitry that dynamically compensates charge pump ripple whenever the charge pump operates.

Another object of the present invention is to provide a phase locked loop-based fractional-N synthesizer and method that uses a plurality of phase detectors to dynamically cancel spurious signals.

Another object of the present invention is to provide a phase locked loop-based fractional-N synthesizer that variously delays at least one output of a plurality of phase detectors to reduce fractional spurs.

Another object of the present invention is to provide a fractional compensation circuit that uses a charge pump stage composed of N charge pumps so that a number of the N charge pumps that operate during a phase comparison is determined by a fractional accumulator stage.

An advantage of a fractional-N architecture and method according to the present invention is that a reference frequency is not restricted by the channel spacing and loop bandwidths can be increased.

Another advantage of a fractional-N architecture and method according to the present invention is that subharmonic spurs or fractional spurs can be kept low.

Another advantage of a fractional-N architecture and method according to the present invention is that the spurious signal cancellation can occur dynamically.

Another advantage of a fractional-N architecture and method according to the present invention is that it avoids the need for compensation current trimming.

Another advantage of a fractional-N architecture and method according to the present invention is that it is robust to environmental changes.

To achieve the above objects in a whole or in part and in accordance with the purpose of the present invention, as embodied and broadly described, a phase locked loop includes a first phase detector that receives an input signal and a first divided signal to output a first comparison signal, a second phase detector that receives the input signal and a second divided signal to output a second comparison signal, a loop filter that receives the first and second comparison signals and generates an output signal responsive to the comparison signals, a voltage-controlled oscillator that receives the output signal from the loop filter and generates a prescribed frequency signal, and a programmable modulus divider that receives the prescribed frequency signal and generates the first and second divided signals having a prescribed phase relationship.

To further achieve the above objects in a whole or in part and in accordance with the purpose of the present invention, as embodied and broadly described, a fractional-N frequency synthesizer for a mobile terminal includes a phase detector circuit that includes a first phase detector having a first input port coupled to receive a reference signal, a second input port, a third input port and an output port, and a second phase detector having a first input port coupled to receive the reference signal, a second input port, a third input port and an output port, a loop filter having a first input port coupled to the output ports of the first and second phase detectors and an output port, a voltage-controlled oscillator having an input port coupled to the output port of the loop filter and transmitting a prescribed frequency signal at an output port, a programmable modulus divider having a first output port coupled to the second input port of the first phase detector to transmit a first divided signal, a second output port coupled to the second input port of the second phase detector to transmit a second divided signal, a first input port coupled to the output port of the voltage-controlled oscillator and a second input port, and an accumulator having a first output port coupled to the second input port of the programmable modulus divider and a second output port coupled to the third input ports of the phase detectors.

Additional advantages, objects, and features of the invention will be set forth in part in the description which follows and in part will become apparent to those having ordinary skill in the art upon examination of the following, or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
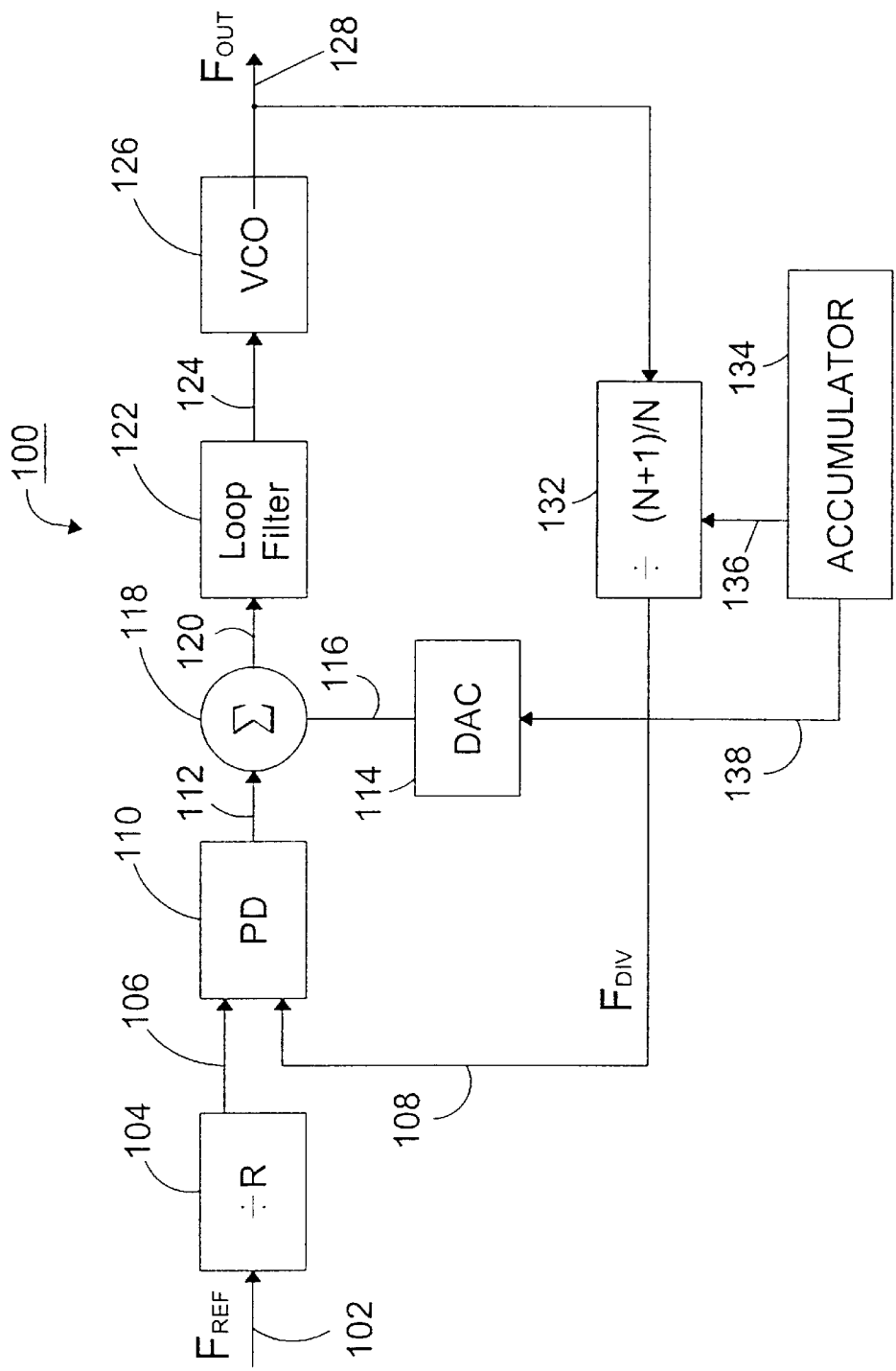
FIG. 1 shows a schematic diagram of a related art fractional compensation circuit that attempts to reduce unwanted spurious signals.
Figure 2:
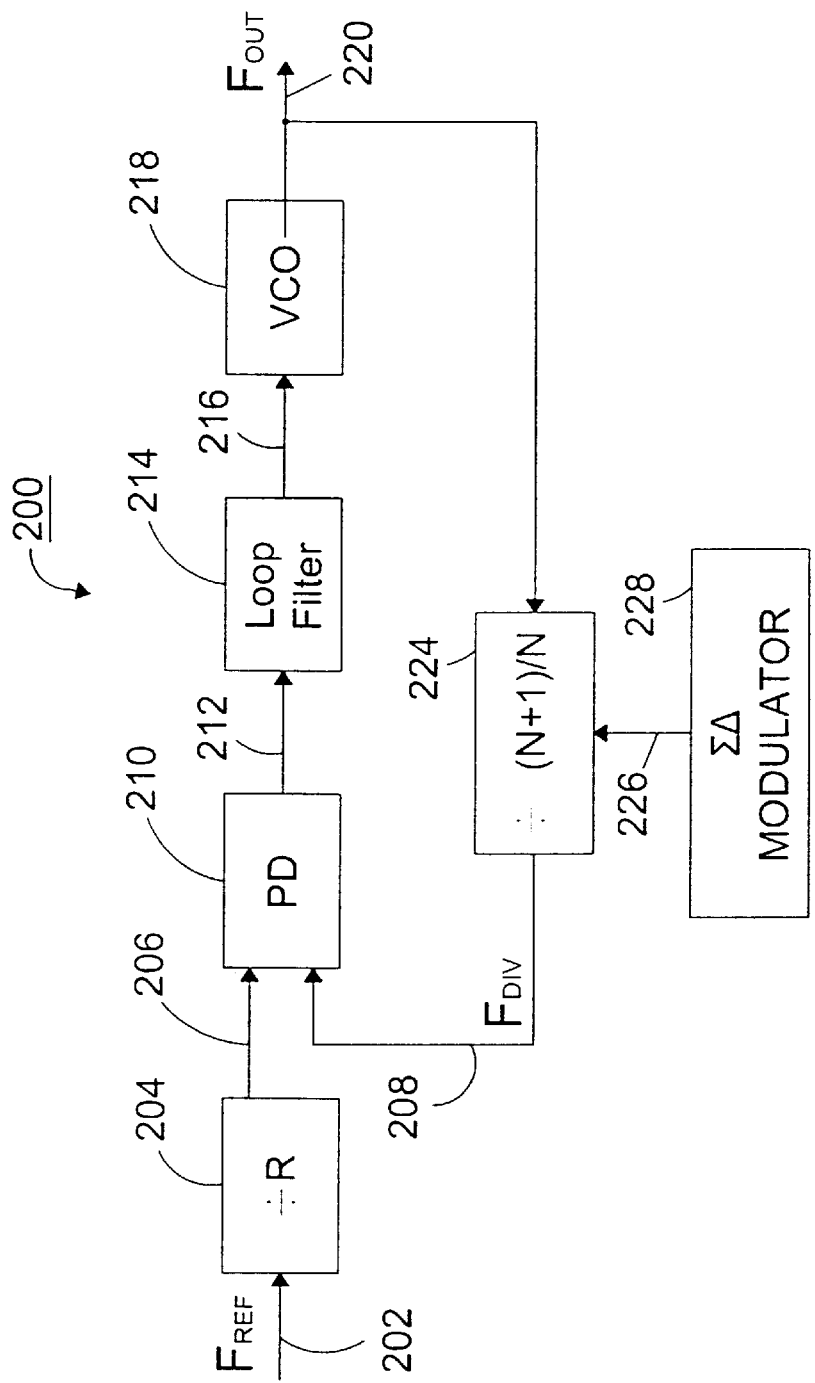
FIG. 2 is a schematic diagram of another related art fractional compensation circuit that controls the dividing ratio by using a sigma-delta modulator.
Figure 3:
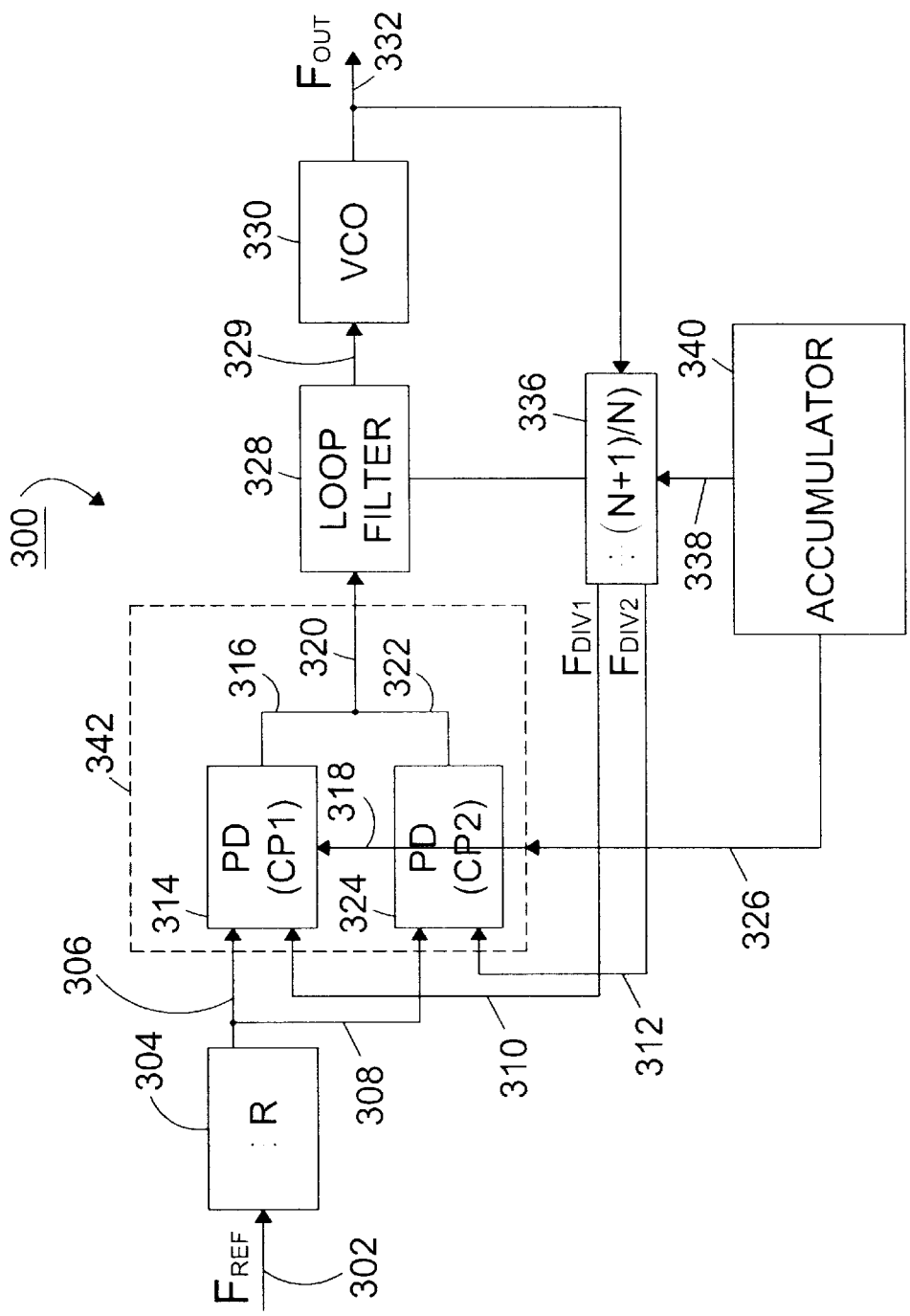
FIG. 3 is a schematic diagram that shows a preferred embodiment of a frequency synthesizer including a phase-locked loop (PLL) according to the invention.

FIG. 3 is a schematic diagram that shows a preferred embodiment of a fractional compensation circuit according to the present invention. As shown in FIG. 3, a frequency synthesizer 300 includes a phase locked loop (PLL) having a phase detector circuit 342, a loop filter 328, a voltage controlled oscillator (VCO) 330, and a programmable modulus divider 336 coupled to an accumulator 340. In the frequency synthesizer 300, a reference frequency 302 is fed into a reference frequency divider 304. The output of the reference frequency divider 304, is branched into two phase detector feeds 306 and 308. The two phase detector feeds 306 and 308, are respectively input to phase detectors 314 and 324 of the phase detector circuit 342. Outputs 316 and 322, of the phase detectors 314 and 324, are coupled into an input 320 of the loop filter (LF) 328. An output 329 of the loop filter 328 is fed into the voltage controlled oscillator (VCO) 330. The phased detector circuit 342, contains the two phase detectors 314 and 324 that preferably contain two charge pump blocks (not shown). The terms "charge pump," "charge pump block," and "CP" refer to the same type circuit and are used interchangeably herein. Where more than one charge pump is referenced, CP1 and CP2 are sometimes used.

The modulus programmable divider 336 divides an output frequency signal $F_{OUT}$ 332 of the VCO 330, alternatively by N and N+1, respectively, depending on the control signal 338 from the accumulator 340. Each of the two divided VCO signals $F_{DIV1}$ and $F_{DIV2}$ from the modulus programmable divider serve as second inputs 310 and 312, respectively, of the phase detectors 314 and 324. The two divided VCO signals $F_{DIV1}$ and $F_{DIV2}$ 310 and 312, produced by the modulus programmable divider 336, preferably have the same frequency and a phase difference that is a period of VCO ($1/F_{OUT}$). N equal charge pumps (not shown) are preferably coupled to each phase detector 314 and 324. The accumulator 340, controls the number of charge pumps to be enabled before the phase comparison in the phase detectors 314 and 324 between the input reference frequency ($F_{REF}$) and the divided VCO clock ($F_{DIV1}$, $F_{DIV2}$) occurs. Thus, the accumulator 340 outputs enable signals 318 and 326, respectively, to the phase detectors 314 and 324.

Figure 4:
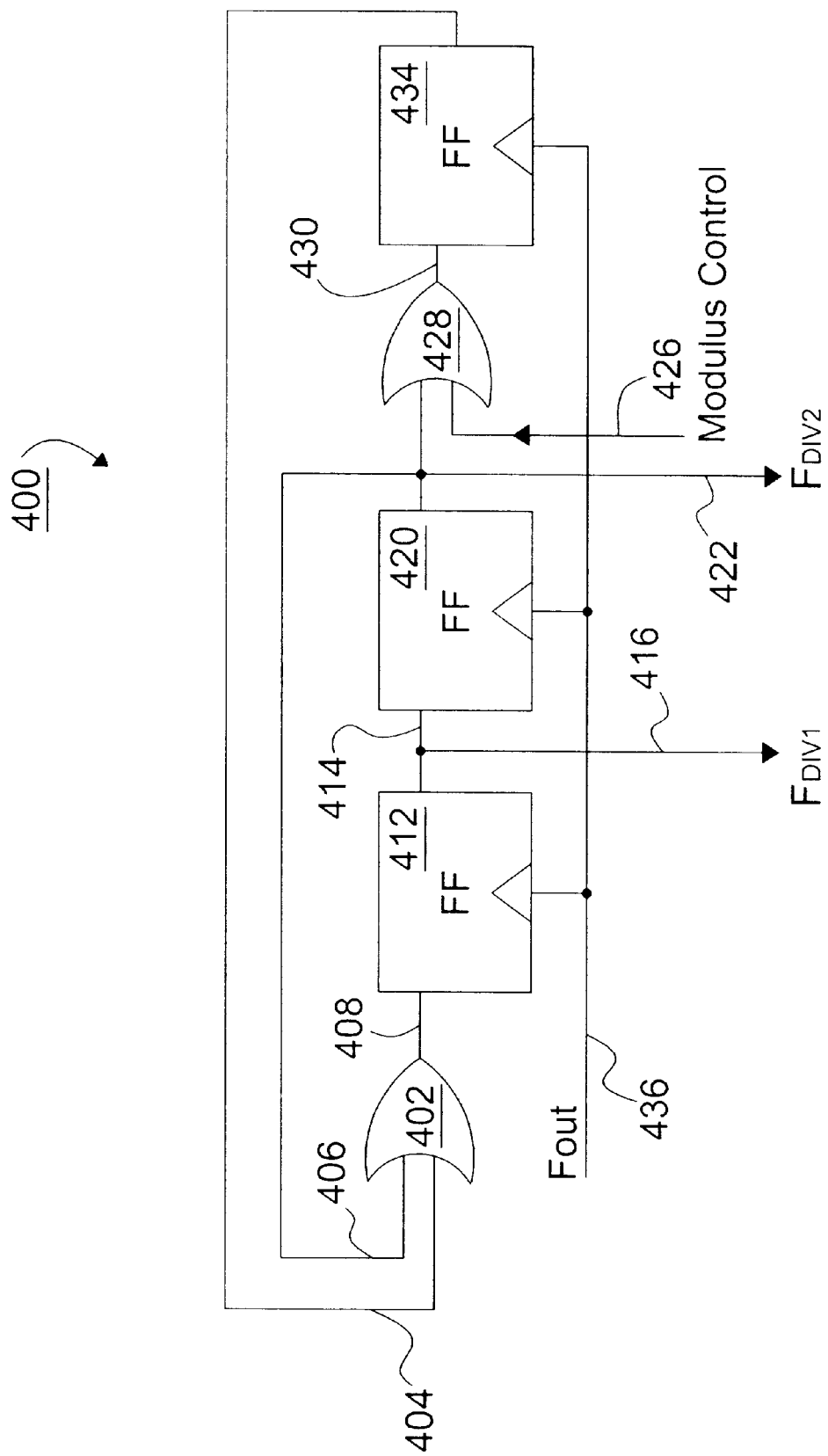
FIG. 4 is a diagram that shows a preferred embodiment of a programmable modulus divider of FIG. 3.

FIG. 4 is a diagram that shows a preferred embodiment of a programmable modulus divider 400, (e.g., dividing an input signal by N+1 or by N, which produces two divided VCO outputs $F_{DIV1}$ and $F_{DIV2}$, 416 and 422. The programmable modulus divider 400 can be used as the programmable modulus divider 336 of FIG. 3. The programmable modulus divider 400 can include three flip flops 412, 420, 434 and two logic gates 402, 428. Since the three flip-flops 412, 420 and 434, are preferably clocked by an identical output signal 436, which is preferably the output frequency signal $F_{OUT}$ 336, the phase difference between $F_{DIV1}$ and $F_{DIV2}$, 416 and 422, is a period of a VCO frequency ($T_{VCO}=1/F_{OUT}$).

As shown in FIG. 4, a first "OR" gate 402, receives an input 404 from the third flip-flop 434, and receives an input 406 from the second flip-flop 420. The first flip-flop 412 receives and processes an output 408 of the first "OR" gate 402 according to the $F_{OUT}$ signal 436. The second flip-flop 420 receives and processes an output 414 from the first flip-flop 412 according to the $F_{OUT}$ signal 436. In addition to the input 406 from the second flip-flop 420, the second "OR" gate 428 receives a modulus control signal as an input 426. The third flip-flop 434 receives and processes an output 430 from the second "OR" gate 428 according to the $F_{OUT}$ signal 436. The output signals 414 and 406 of the first and second flip flop 412, 420 are preferably the divided VCO signals $F_{DIV1}$ 416 and $F_{DIV2}$ 422 from the programmable modulus divider 400.

Figure 5:
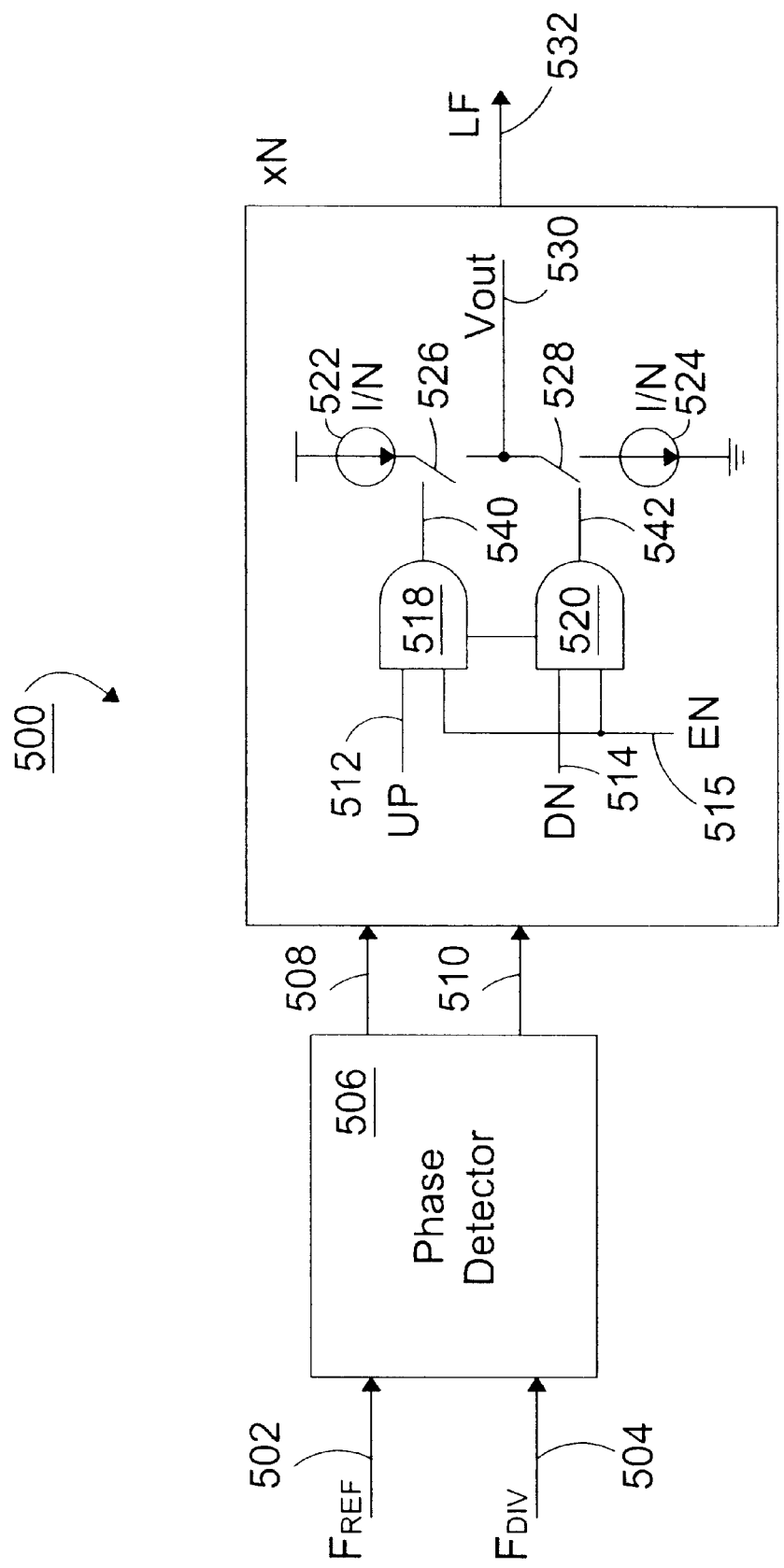
FIG. 5 is a diagram that shows a phase detector circuit having a charge pump bock with a charge pump stage following phase detectors.

FIG. 5 is a diagram that shows a preferred embodiment of a phase detector and charge pump circuit 500. As shown in FIG. 5, the phase detector and charge pump circuit 500 can be used, for example, as one of the phase detectors 314, 324 in the phase detector circuit 342 shown in FIG. 3. The charging or discharging current provided from each charge pump to the LF (not shown) is preferably determined as I/N, where I is the current of a typical fractional-N frequency synthesizer. An enable signal (EN) 515, is generated by the corresponding accumulator (not shown) such as the accumulator 340 according to the fractional accumulator state, and controls whether the charge pump 534 is enabled. As shown in FIG. 5, there are preferably N charge pumps 534 coupled to the phase detector 506 that receive an enable signal from an accumulator.

As shown in FIG. 5, a phase detector 506 compares an $F_{REF}$ input 502 as a divided reference frequency, and an $F_{DIV}$ input 504 to generate two outputs 508 and 510, each received by a charge pump circuit 534, responsive to the comparison. A first "AND" gate 518 of the charge pump 534 receives an "UP" signal 512 and the "EN" signal 515. A second "AND" gate 520, receives a "DN" signal 514, and the "EN" signal 515. Preferably, the output signal 508 is the "UP" signal 512 and the output signal 510 is the down "DN" signal 514. A first switch 526 and a first current source 522 are coupled in series between a power supply voltage and an output terminal 530. The state of the first switch 526 (e.g., open or closed) is controlled by an output signal 540 from the first "AND" gate 518 responsive to the comparison in the corresponding phase detector and the enable signal EN. A second switch 528 and a second current source 524 are coupled in series between the output terminal 530 and a ground reference voltage. The state of the second switch 528 is preferably controlled by an output signal 542 from the second "AND" gate 520. Thus, the first current source 522 and the second current source 524, are selectively coupled into the single output terminal 530 of the charge pump 534. An output 532 of the N charge pumps 534 of phase detector and charge pump circuit 500 is received by the loop filter (not shown). Output terminals 530 of the N charge pumps 534 are coupled to provide the output 532 to the loop filter. However, the present invention is not intended to be so limited.

Figure 6:
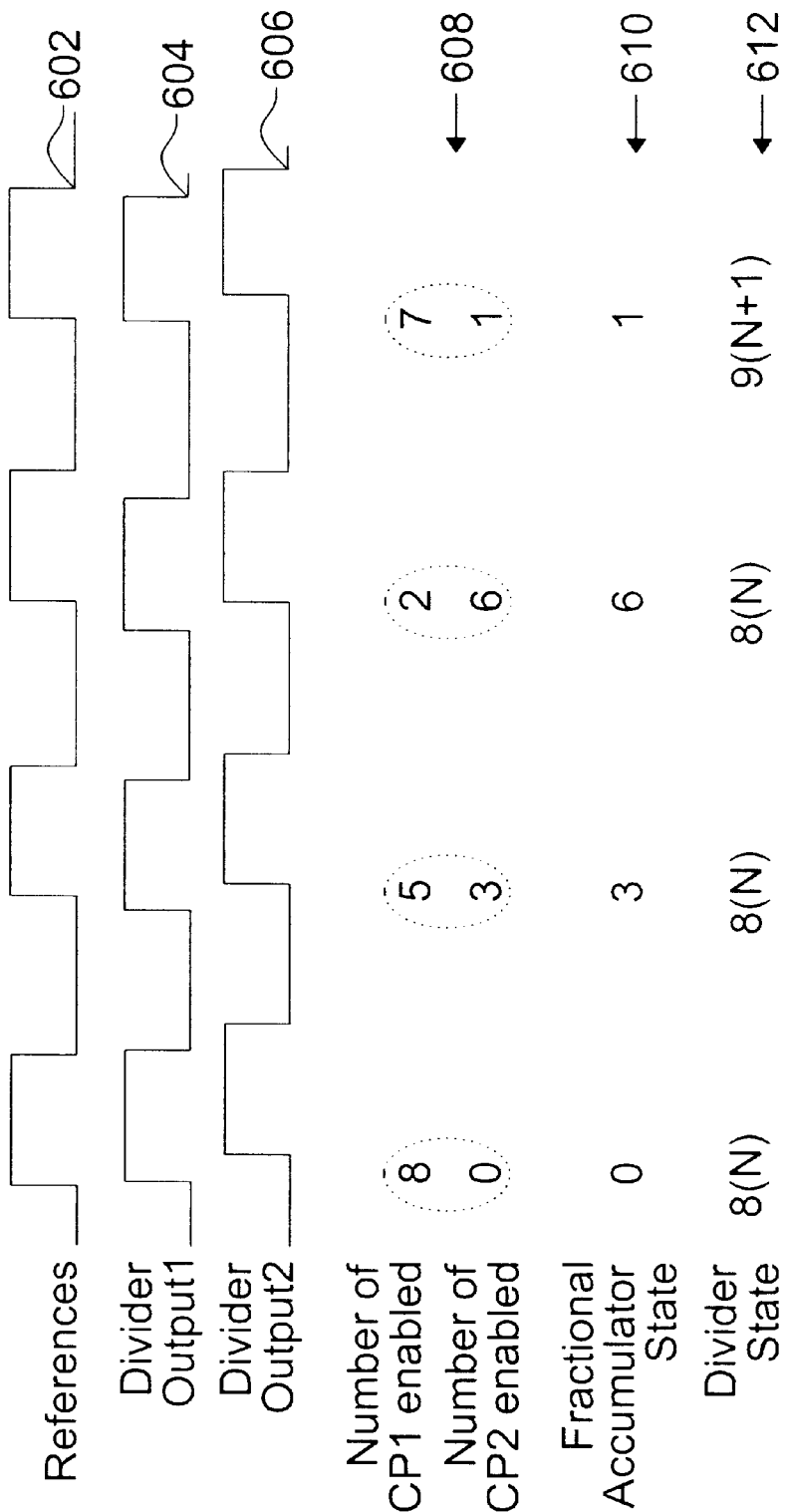
FIG. 6 is a diagram that shows a control timing diagram of a charge pump block of FIG. 5.

The control timing relationship of a charge pump block is described in FIG. 6 where the fractional number is assumed as 3/8(K=3,N=8). Accordingly, the modulus divider divides by 8(N) 5 times and by 9(N+1) 3 times out of 8 cycles. The timing relationship shown in FIG. 6 can be used for the charge pump block associated with each phase detector 314, 324 of FIG. 3. Thus, for example, the phase detector circuit 342 could include 2(N=8) or 16 charge pump stages 534.

The waveforms shown in FIG. 6 are the divided reference frequency voltage 602, and the voltages of the outputs of the modulus programmable divider 604 and 606 (e.g., 310, 312). The number of enabled charge pumps for CP1 and CP2 (e.g., within PD 314 and PD 324) are indicated by 608, and the state of the fractional accumulator is indicated by 610. The divider state of the synthesizer is indicated by 612. As shown in FIG. 6, the number of charge pumps (CP1 and CP2) enabled during the phase comparison is determined by the accumulator state 610. The total number of charge pumps enabled is always fixed as the division factor N.

Figure 7:
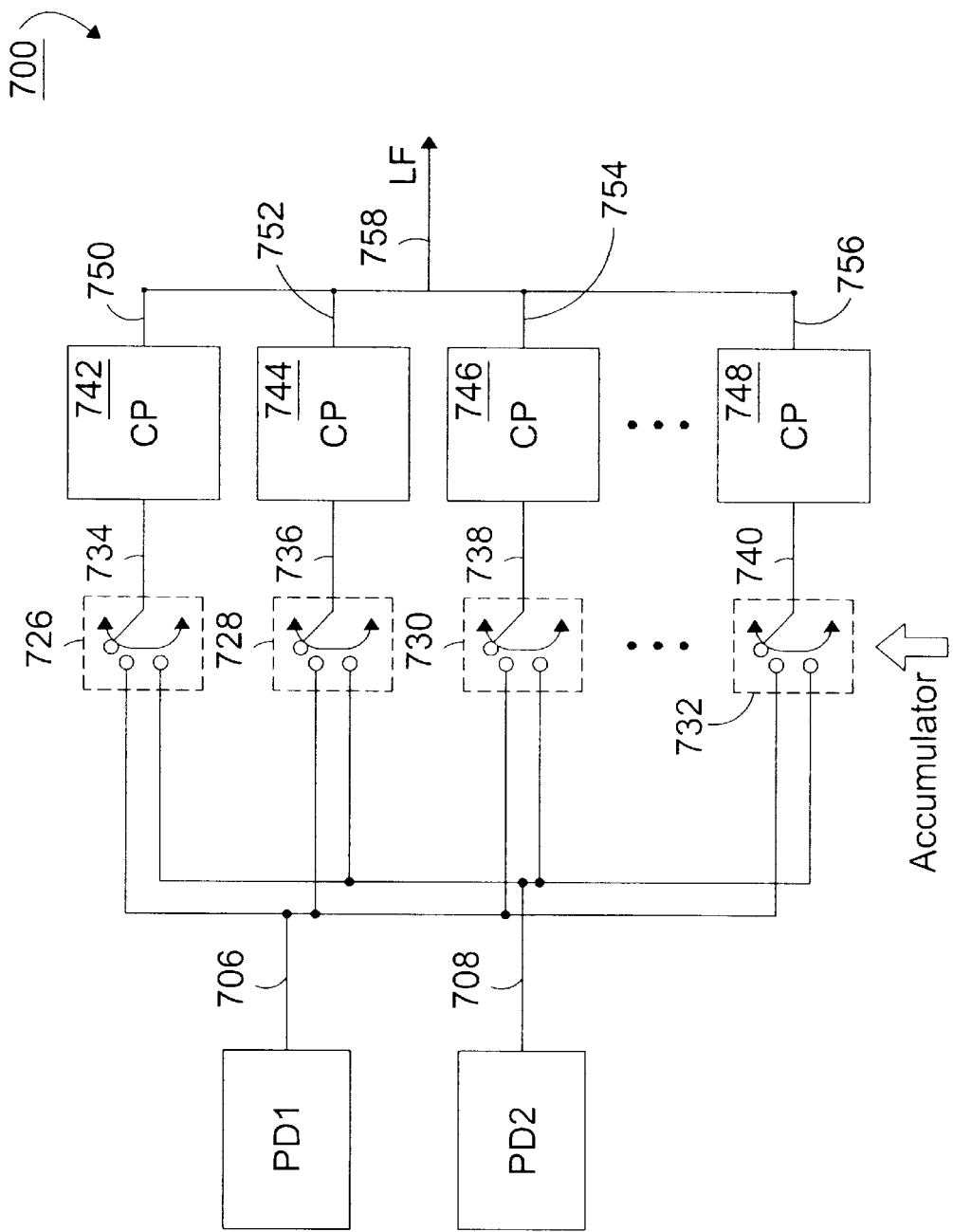
FIG. 7 is a diagram that shows another embodiment of a phase detector circuit including a charge pump block in which a number of charge pumps is reduced to N compared to a total of 2N charge pumps in FIG. 5.

Another preferred embodiment of a phase detector circuit including a charge block pump with N charge pumps is illustrated in FIG. 7. As shown in FIG. 7, a charge pump block 700 receives the output 706 of the first phase detector PD1, which serves as a series of first inputs to switches 726, 728, 730, . . . , 732, respectively. The output 708 of the second phase detector PD2 serves as a series of second inputs to the switches 726) 728, 730, . . . , 732, respectively. Respective switch outputs 734, 736, 738 . . . , 740, of the switches 726, 728, 730 and 732 serve as inputs to the charge pumps 742, 744, 746 . . . , 748. Outputs 750, 752, 754, . . . , 756 of the preferably N charge pumps 742, 744, 746 . . . , 748, are coupled into an output signal 758 to be connected to the loop filter (not shown). In the charge pump block 700, the number of charge pumps is reduced to N, compared to a total of 2N charge pumps of FIG. 5, when the accumulator controls the connection of the phase detectors PD1 and PD2 to the charge pumps 726, 728, 730, . . . , 732, as shown in FIG. 7.

Figure 8A:
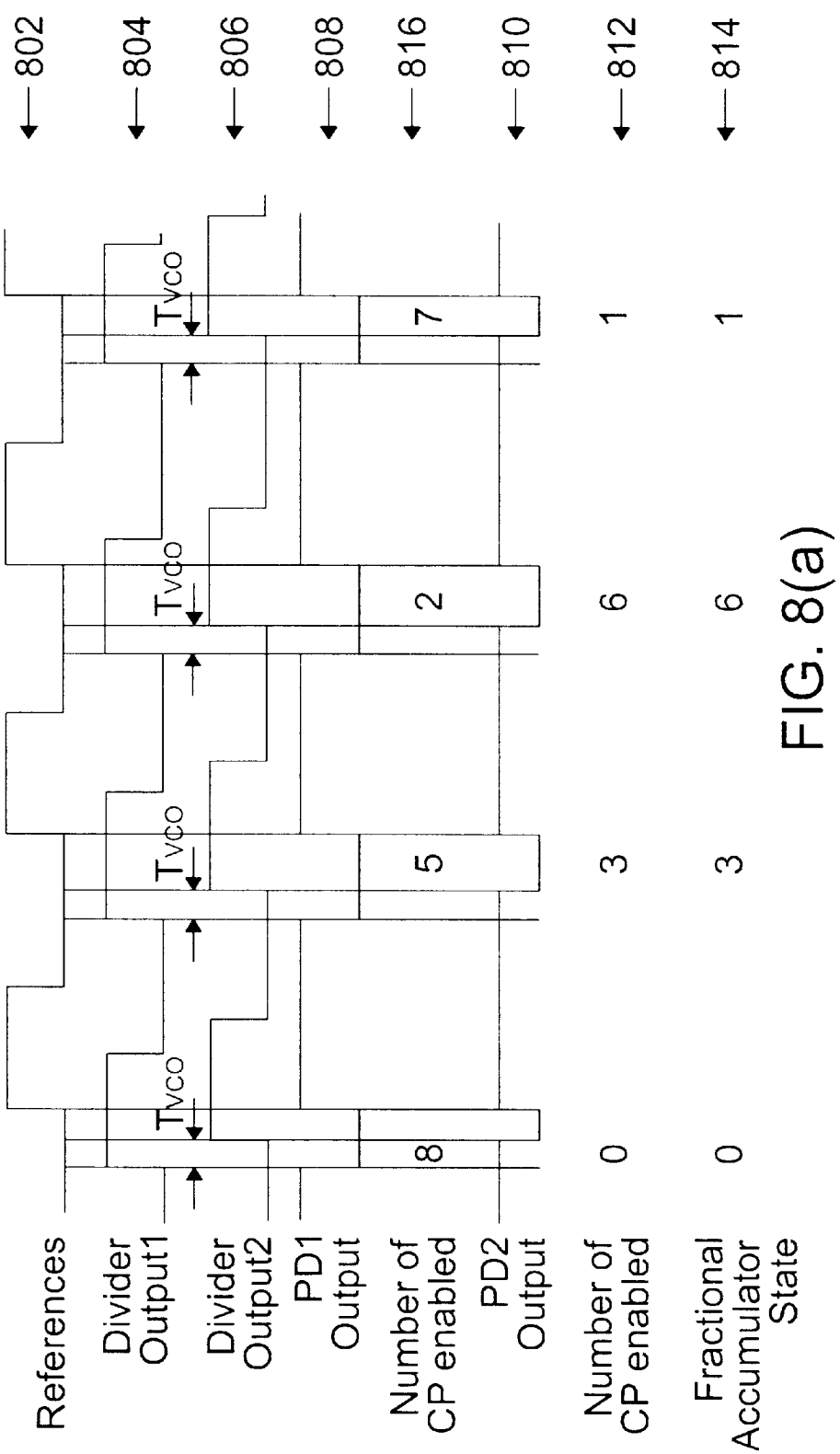
FIGS. 8(a) and 8(b) show timing diagrams of the phase lag and lead, respectively, of a divided reference frequency and a divided VCO frequency.

The phase relationship between a divided reference frequency and a divided VCO frequency is shown in FIGS. 8($a$) and 8($b$). FIG. 8($a$) illustrates a relative phase lag of the divided reference signal, and FIG. 8($b$) shows a relative phase lead of the divided reference signal. For example, FIGS. 8($a$) and 8($b$) can show a phase relationship between the divided reference frequency 306 and the divided VCO frequencies 310, 312 of the frequency synthesizer 300 of FIG. 3. As shown in FIGS. 8($a$) and 8($b$), the relative voltage waveforms include the reference frequency 802, the Divider Output$_1$ 804, the Divider Output$_2$ 806, the PD1 output 808, and the PD2 output 810. The number of enabled charge pumps 812 and 816, which is always the division factor N, and the fractional accumulator state 814, are also indicated relative to the waveforms.

Figure 8B:
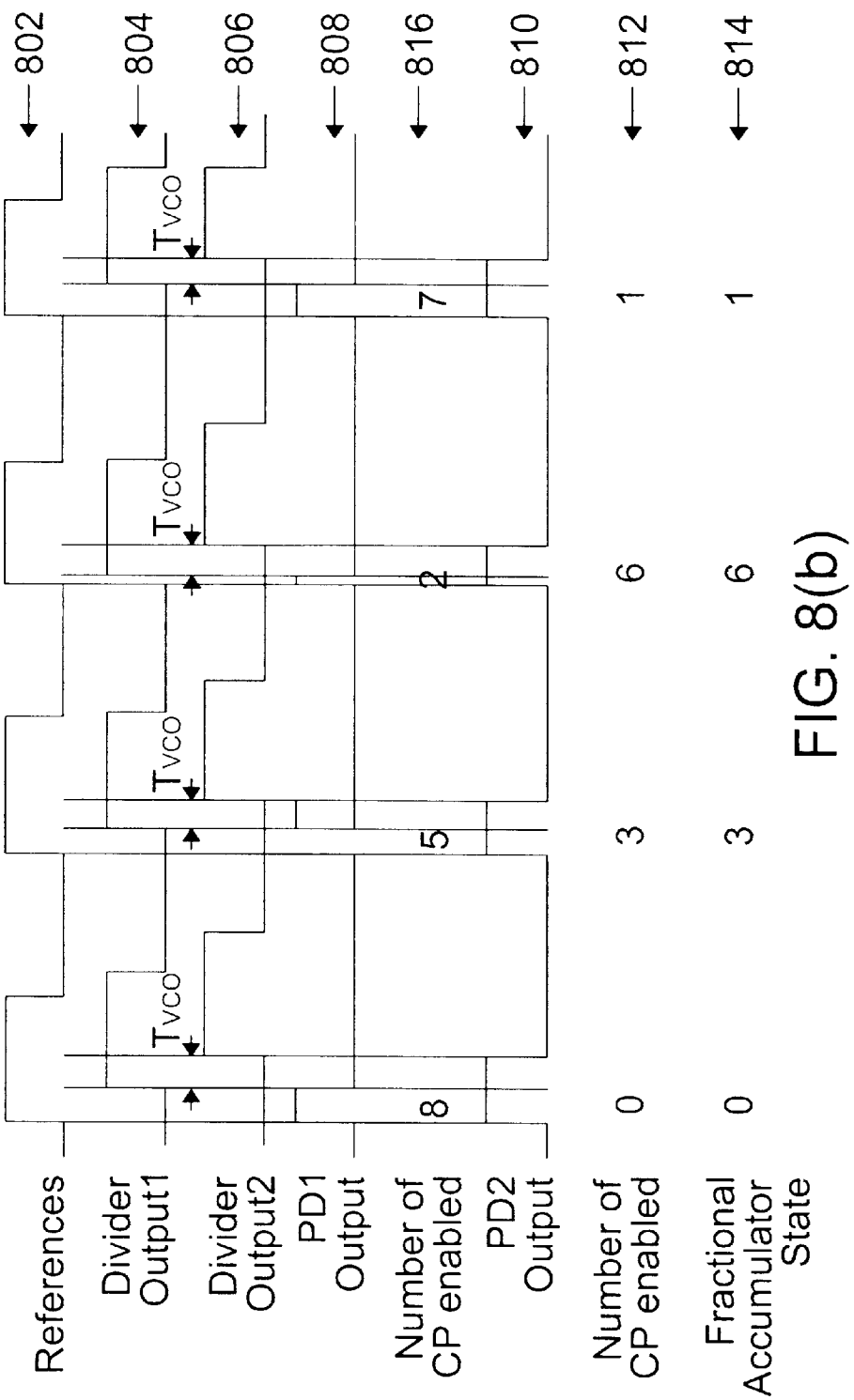

In FIG. 8($a$), both outputs 808 and 810 of the phase detectors, in response to a phase lag of the divided reference frequency ($F_{REF}$) 802, cause all charge pumps to discharge (e.g., generate a "DOWN" signal) the loop filter to decrease the VCO output frequency. Conversely, in FIG. 8(b) a phase lead of the divided reference frequency causes both the outputs 808 and 810 of the phase detectors discharge all the charge pumps (e.g., generate the "UP" signal) and causes the VCO to increase its output frequency. In a locking state, the phase of the divided reference frequency ($F_{REF}$) 802, is laid between two divided VCO frequencies $F_{DIV1}$ and $F_{DIV2}$, 804 and 806, which means that one phase detector (PD1) generates a "DOWN" signal and the other (PD2) generates an "UP" signal. Thus, in the locking state, charge pumps connected to PD1 discharge the loop filter and charge pumps connected to PD2 charge the loop filter to preferably keep the loop filter voltage constant.

Figure 9:
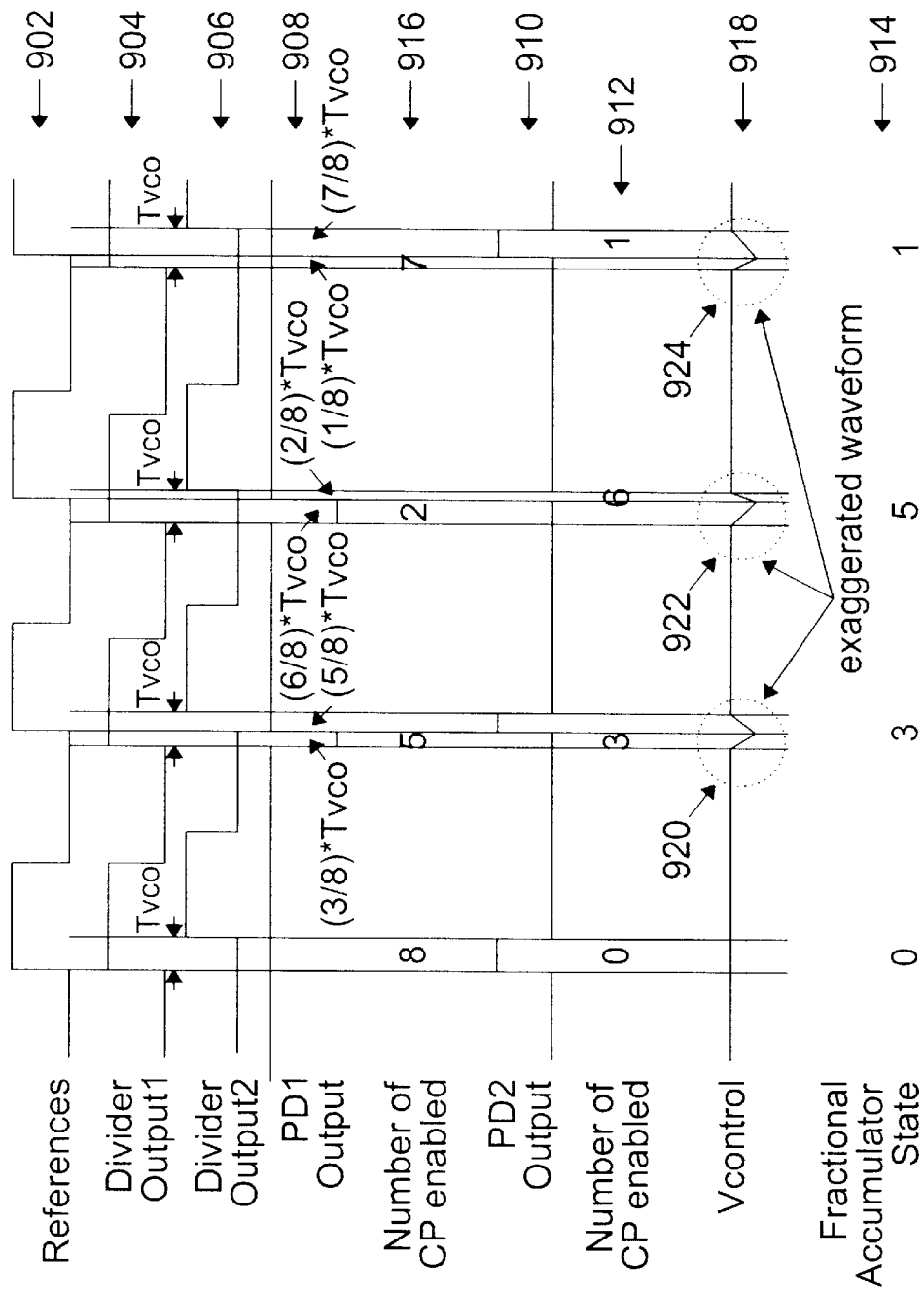
FIG. 9 shows a timing diagram of a compensation scheme according to a preferred embodiment of the invention.

FIG. 9 is a timing diagram that shows fractional compensation according to a preferred embodiment of the present invention. For example, FIG. 9 can show can show a phase relationship between the divided reference frequency 306 and the divided VCO frequencies 310, 312 of the frequency synthesizer 300 of FIG. 3. In FIG. 9, it is assumed that the fractional number is ⅜(K=3, N=8) as described above in FIG. 6. As shown in FIG. 9, the relative voltage waveforms of the divided reference frequency 902, the Divider Output$_1$ 904, the Divider Output$_2$ 906, the PD1 output 908, the PD2 output 910, and the control voltage 918 are shown. Sections of the amplitude 920, 922 and 924 of the control voltage 918 are magnified for clarity in FIG. 9. The number of enabled charge pumps 912 and 916, and the fractional accumulator state 914, are also indicated relative to the waveforms.

In a locked state of a frequency synthesizer as shown in FIG. 9, the charge pumps (CP1) connected to PD1 always sink current from the loop filter while those (CP2) connected to PD2 always source current to the loop filter. The amount of discharging current by the CP1 is given by the equation:

$$Q_{discharge}=I_{discharge}*T_{discharge}=\{(N-K)*(I/N)\}*\{(K/N)*T_{VCO}\} \quad (\text{Eq. 1})$$

where K represents the accumulator state. Similar to Eq.1, the amount of charging current by the CP2 is given by the equation:

$$Q_{charge}=I_{charge}*T_{charge}=\{K*(I/N)\}*[\{(N-K)/N\}*T_{VCO}] \quad (\text{Eq. 2})$$

From (Eq. 1) and (Eq. 2), $Q_{charge}$ and $Q_{discharge}$ are always the same. Accordingly, the charging current and the discharging current compensate each other to keep the loop filter output voltage constant in the locked state. The loop characteristic of the PLL preferably keeps the phase relationship to satisfy the above equations and the loop filter voltage is preferably kept constant irrespective of environmental changes such as temperature. Hence, the fractional spur is compensated dynamically. Further, no compensation current trimming is required. Further, the small perturbation of loop filter voltage during phase comparison in FIG. 9 shows negligible fractional spur and phase noise compared to the related art fractional-N architecture because it does not change the average level of the control voltage and it occurs during a very short time of a period of VCO frequency.

However, preferred embodiments according to the present invention are not restricted to the above case or intended to be so limited. For example, by changing the phase difference between the divided signals and number of charge pumps used, other combinations to implement the fractional compensation of a reference signal according to the invention are possible.

Figure 10:
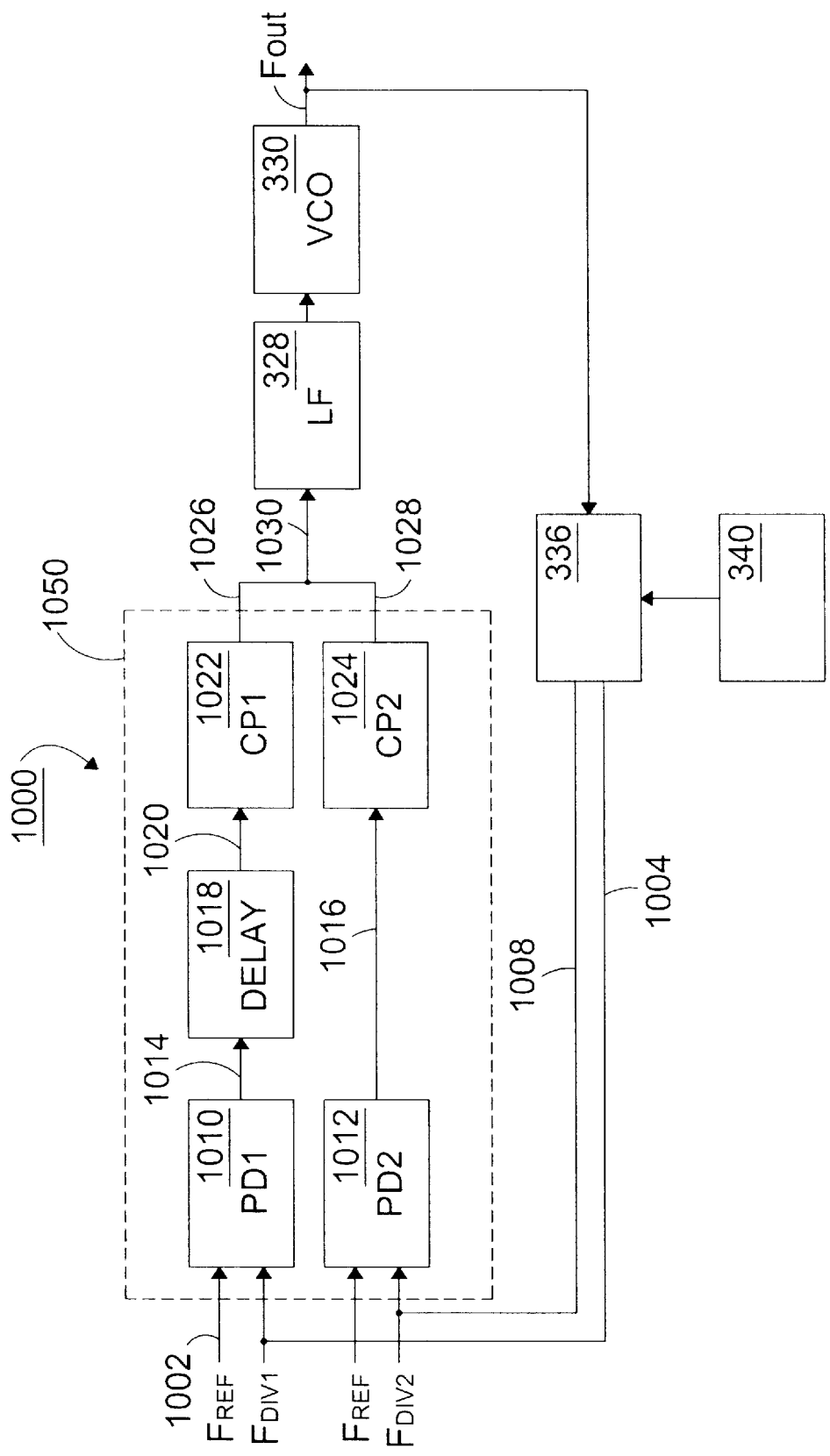
FIG. 10 is a diagram that shows another preferred embodiment of a frequency synthesizer including a PLL with a delay in a phase detector circuit.

Another embodiment of a frequency synthesizer including a phase locked loop according to the present invention is illustrated in FIG. 10. As shown in FIG. 10, a frequency synthesizer 1000 receives a reference frequency 1002 that is input to a first and second phase detector 1010 and 1012, respectively. The first phase detector 1010 also receives a first divided VCO frequency 1004, and the second phase detector 1012 also receives a second divided VCO frequency 1008. The delay 1018 receives an output 1014 of the first phase detector 1010 and preferably outputs the same after a prescribed delay. The first charge pump 1022 receives an output 1020 of the delay block 1018, and the second charge pump 1024 directly receives the output 1016 of the second phase detector 1012. The output 1026 of the first charge pump 1022 and the output 1028 of the second charge pump 1024 are coupled together and serve as the input 1030 to a loop filter such as the loop filter 328. Preferably, the VCO 330, the modulus programmable divider 336 and the accumulator 340 are coupled to the loop filter 328 and a phase detector circuit 1050. In the preferred embodiment of FIG. 10, by introducing a delay to the output of one of the first and second phase detectors 1010 and 1012, the perturbation in the loop filter voltage 1030 is further reduced. As shown in FIG. 10, the output 1014 of the first phase detector 1010 is delayed to reduce or minimize the perturbation of the loop filter voltage. However, the present invention is not intended to be so limited.

Figure 11:
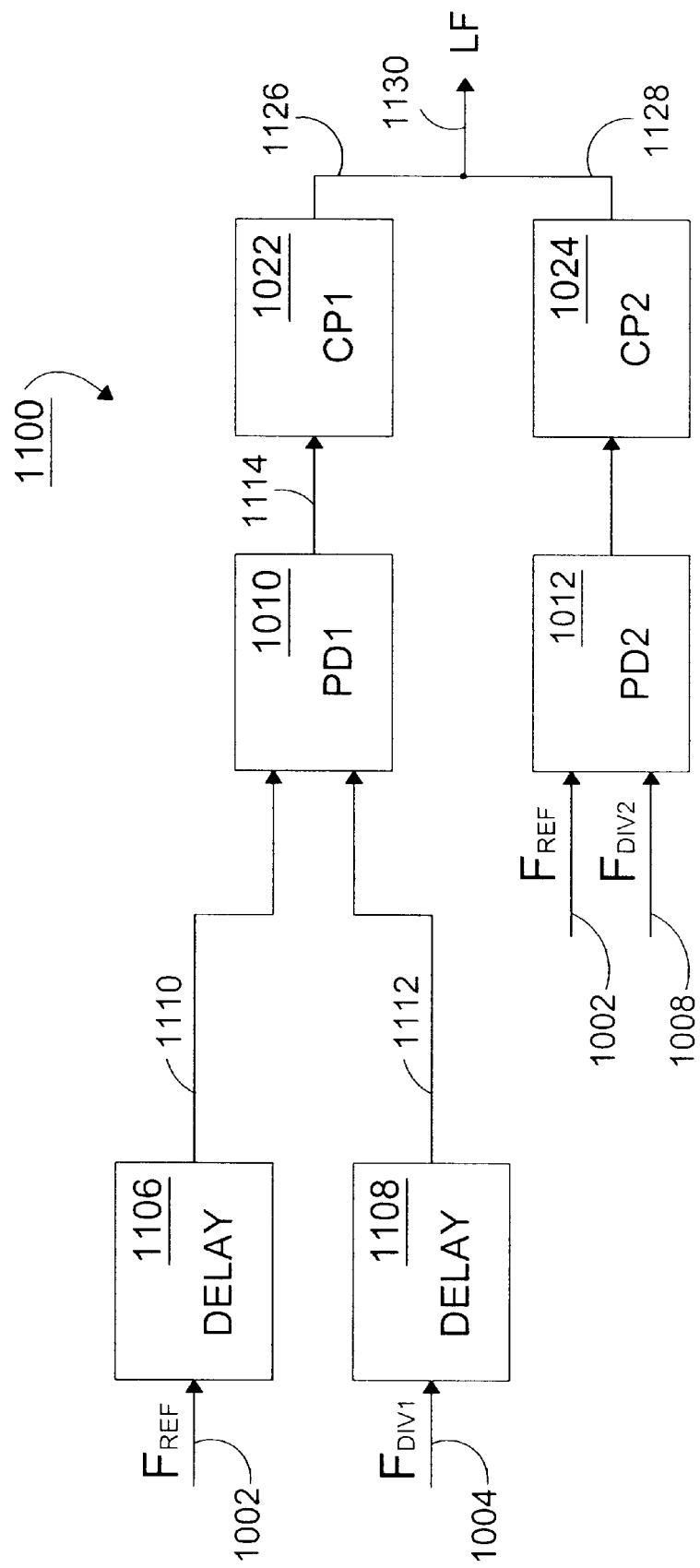
FIG. 11 is a diagram that shows another preferred embodiment of a phase detector circuit having a delay.

For example, the delay block 1018 as shown in FIG. 10 may be placed in front of the first phase detector 1010 to preferably achieve the same effect described above. As shown in FIG. 11, another preferred embodiment of a phase detector circuit 1100 for a frequency synthesizer includes a first delay block 1106 that receives the reference frequency input 1002 and a second delay block 1108 that receives the first divided VCO frequency 1004. The first phase detector 1010, receives and processes an output 1110 of the first delay block 1106 and an output 1112 of the second delay block 1108. The second phase detector 1012 and the second charge pump 1024 operate as described above. However, the first charge pump 1022 directly receives an output 1114 from the first phase detector 1010. An output 1126 from the first charge pump 1022 and an output 1128 from the second charge pump 1024 are combined and serve as the input 1130, to the loop filter (not shown).

Figure 12:
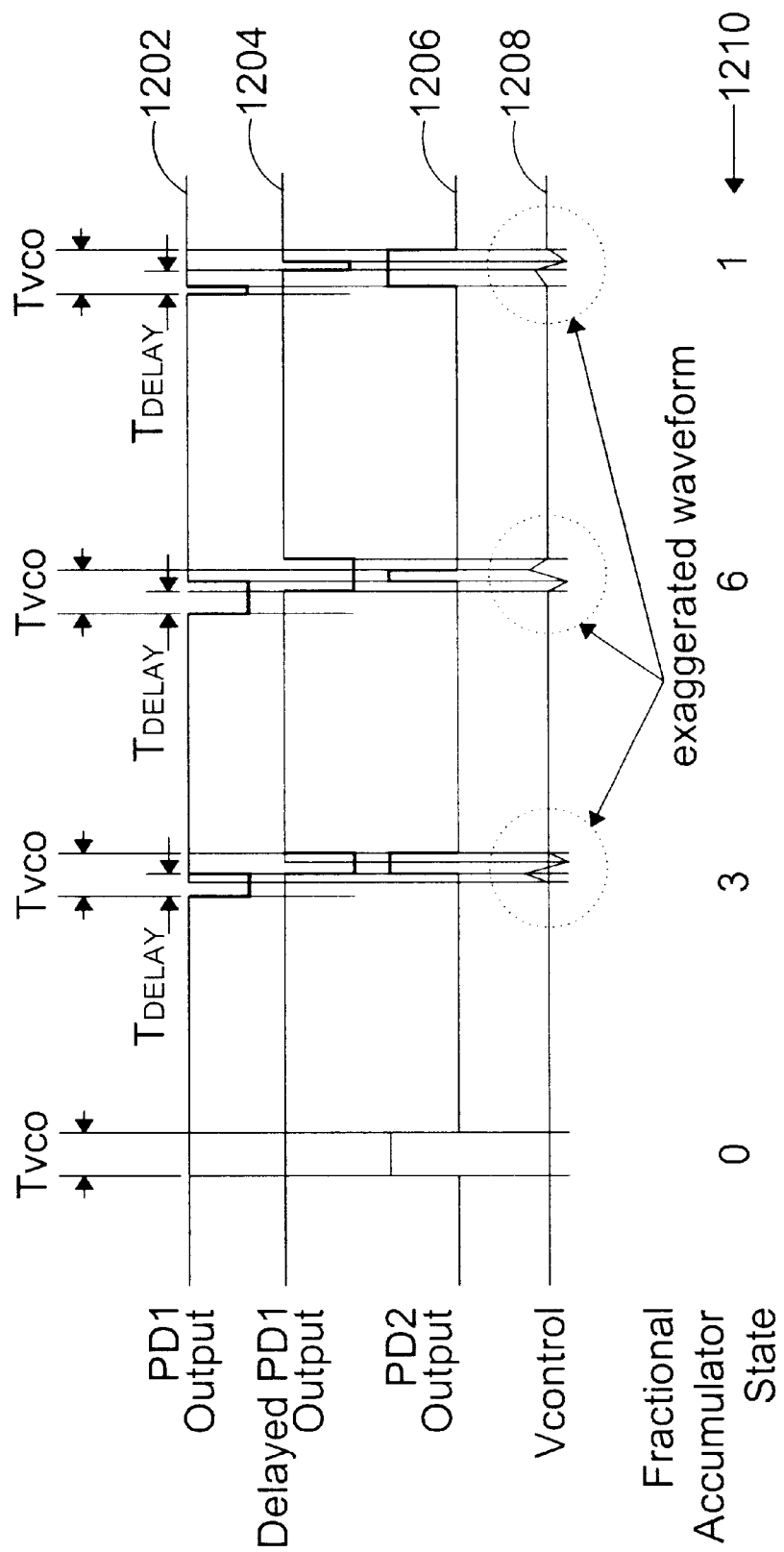
FIG. 12 is a timing diagram showing effects of introducing a delay in a phase detector circuit.

Operations and effects of delays such as generated in the preferred embodiments shown in FIGS. 10–11 will now be described. As shown in FIG. 12, the voltage output of a first phase detector is represented by the waveform 1202, a delayed output of the first phase detector is represented by the waveform 1204, and an output of a second phase detector is represented by the waveform 1206. A voltage control signal is represented by the waveform 1208, where an illustrated amplitude is exaggerated for clarity in sections 1212, 1214, and 1216. Further, a state of a fractional accumulator is indicated by 1210.

As shown in FIG. 12, the "DOWN" signal of PD1 and the "UP" signal of PD2 are overlapped. Hence, the charging current and the discharging current are simultaneously applied to the loop filter and compensate each other to reduce or minimize a peak-to-peak variation of the loop filter voltage. As long as the delayed PD1 signal 1204 and PD2 signal 1206 overlap, operations of the preferred embodiments of FIGS. 10–11 are effective to reduce the loop filter voltage. However, preferred embodiments of the present invention are not intended to be so limited. For example, the delay could be accomplished in the PD2 signal or both PD1 and PD2 signals. Further, an optimum or prescribed delay according to the division ratio can be set, for example, by the controlling accumulator.

Figure 13:
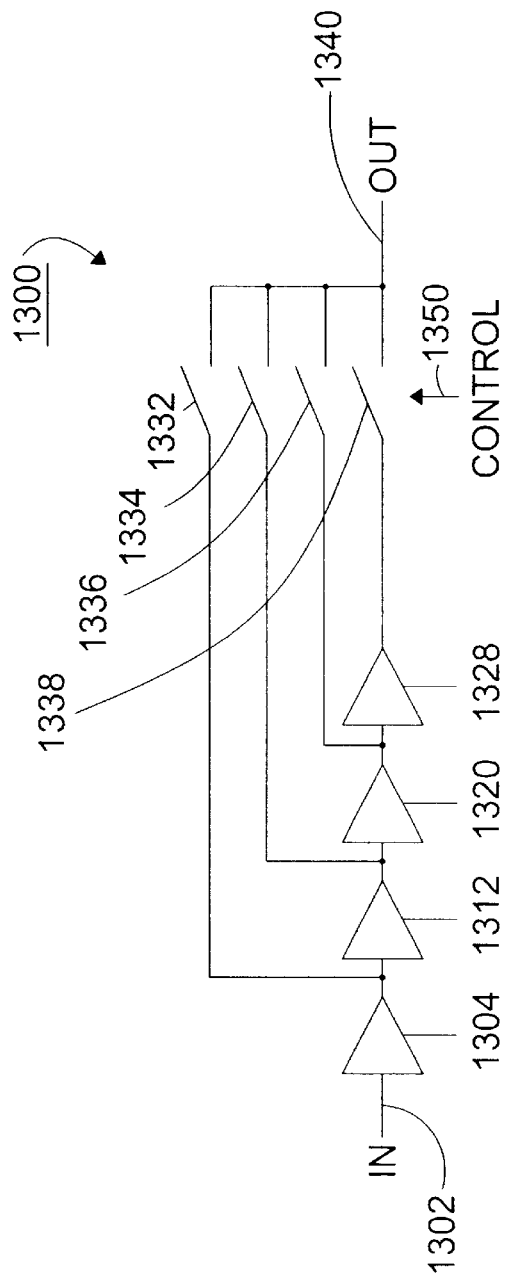
FIG. 13 is a diagram that shows an exemplary digital control circuit where a number of delay taps switched into the circuit determines the delay.
Figure 14:
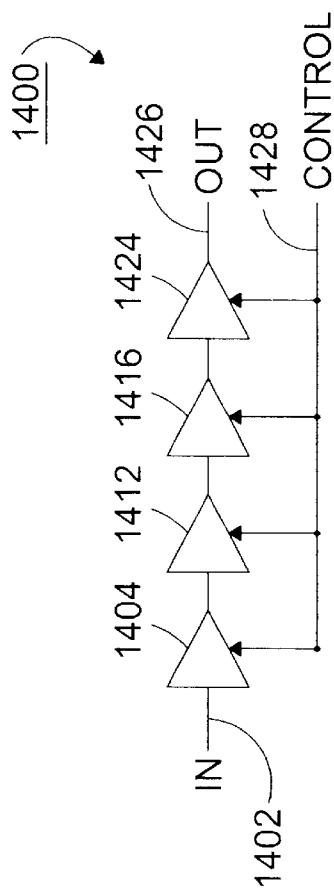
FIG. 14 is a diagram that shows an exemplary analog circuit where the control voltage controls the delay of each delay cell and the total delay of the circuit.

FIGS. 13 and 14 are diagrams that show exemplary delay control circuits. FIG. 13 shows a digital control circuit 1300, where series coupled delay taps 1304, 1312, 1320, and 1328 are coupled between an input terminal 1302 and an output terminal 1340. A number of the delay taps 1304, 1312, 1320 and 1328 that are switched into the circuit determines a prescribed delay between an input signal IN and an output signal OUT. The digital delay control circuit 1300, receives the signal to be delayed as the input signal IN at the input terminal 1302. The delay taps can be, for example, an inverter. A plurality of switches 1332, 1334, 1336, 1338 are respectively connected between outputs of the delay taps 1304, 1312, 1320 and 1328 and the output terminal 1340. On/off states of the switches 1332, 1334, 1336, and 1338, are preferably determined by the control signal 1350. Thus, a total delay of the digital delay control circuit 1300 is controlled by the state of the switches 1332, 1334, 1336, and 1338.

FIG. 14 shows an analog delay control circuit where a control voltage controls the delay of each delay cell and thereby a total delay of the circuit. As shown in FIG. 14, an analog delay control circuit 1400, receives an input signal IN at an input terminal 1402 coupled to a first delay cell 1404. Delay cells 1412, 1416 and 1422 are connected in series between the first delay cell 1404 and an output terminal 1426. The delay cells 1404, 1412, 1416 and 1422 each receive a control voltage CONTROL 1428, which determines a delay generated by each of the delay cells, and thus, the control voltage 1428 determines a cumulative prescribed delay between the input signal IN and the output signal OUT. As described above, more or less delay taps or delay cells can constitute the exemplary delay circuits.

As described above, preferred embodiments of a frequency synthesizer have various advantages. A frequency synthesizer including a phase-locked loop (PLL) according to the preferred embodiments incorporates fractional spur compensation circuitry to dynamically compensate charge pump ripple whenever a charge pump operates. In the preferred embodiments, a programmable divider produces two output signals that are preferably divided signals from a voltage controlled oscillator (VCO) with the same division ratio for input to two phase detectors of the PLL. Thus, a phase difference of the divided VCO signals is preferably a period of the VCO output. In a locked state of a frequency synthesizer, the phase of the corresponding reference signals occurs between these divider signals. In a preferred embodiment, two phase detectors (PD) are used each having an input terminal connected to receive one of the two divided VCO signals of the divider. A second input terminal of each phase detector is connected to receive a reference signal. Therefore, one PD produces an "UP" signal and the other a "DOWN" signal in the locking stage.

A charge pump block can include N equal charge pump stages and is connected to each phase detector output terminal. The output terminal of each charge pump is combined in the loop filter. The number of charge pumps which operate during a phase comparison is determined by a fractional accumulator stage. In the locking state, the amount of charging current and discharging current is always the same and compensate each other. Hence, no fractional ripple occurs. Thus, preferred embodiments according to the present invention avoids or reduce the need for compensation current trimming. Fractional compensation is dynamic, and is robust to the environmental changes such as circuit age, process and temperature. Thus, preferred embodiments of a frequency synthesizer can be implemented by changing the phase difference of the divided signals of the programmable divider and the number of charge pumps activated.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A phase locked loop, comprising:
   a first phase detector that receives an input signal and a first divided signal to output a first comparison signal;
   a second phase detector that receives the input signal and a second divided signal to output a second comparison signal;
   a loop filter that receives the first and second comparison signals and generates an output signal responsive to the comparison signals;
   a voltage-controlled oscillator that receives the output signal from the loop filter and generates a prescribed frequency signal; and
   a programmable modulus divider that receives the prescribed frequency signal and generates the first and second divided signals having a prescribed phase relationship.

2. The phase-locked loop of claim 1, further comprising a plurality of parallel switches operated by a control line, wherein each of the switches couple a corresponding one of a plurality of charge pumps to a selected one of the first and second comparison signals, depending on the position of said each switch.

3. The phase-locked loop of claim 2, wherein each of the charge pumps performs one of sourcing and sinking a prescribed amount of current to the loop filter.

4. The phase-locked loop of claim 1, wherein the first phase detector comprises:
   a phase detector portion with a first output port and a second output port; and
   a charge pump portion having a plurality of charge pump stages.

5. The phase-locked loop of claim 4, wherein each of the charge pump stages comprises:
   a first current source and a first switch coupled in series between a first prescribed voltage and a charge pump output terminal;
   a second current source and a second switch coupled in series between a second prescribed voltage and the charge pump output terminal;
   a first logic gate with a first input coupled to the first output port of the phase detector portion, a second input that receives a control signal and an output port coupled to the first switch; and
   a second logic gate with a first input coupled to the second output port of the phase detector portion, a second input that receives the control signal and an output port coupled to the second switch.

6. The phase-locked loop of claim 5, wherein the first and second logic gates are AND gates, wherein an output of the first and second AND gates select one of the first and second switches to couple the charge pump output terminal to one of the first and second current sources.

7. The phase-locked loop of claim 1, further comprising:
a signal delay device coupled to delay one of the first comparison signal and the second comparison signal output from the first and second phase detectors, respectively.

8. The phase-locked loop of claim 1, further comprising a signal delay device coupled to one of the first and second phase detectors.

9. The phase-locked loop of claim 8, wherein the signal delay device is one of a digital delay control circuit and an analog delay control circuit.

10. The phase-locked loop of claim 1, wherein the first and second divided signals have the same frequency.

11. The phase-locked loop of claim 1, wherein the programmable modulus divider comprises:
a first logic gate;
a second logic gate that receives a control signal;
a first flip-flop coupled to receive an output signal of the first logic gate and a clock signal from the output port of the voltage-controlled oscillator;
a second flip-flop gate coupled to receive an output signal of the first flip-flop, wherein the first and second logic gates receive an output signal of the second flip-flop; and
a third flip-flop coupled to receive an output signal from the second logic gate, wherein the first, second and third flip-flops receive the prescribed frequency signal as a clock signal, wherein an output signal of the third flip-flop is received by the first logic gate, and wherein the output signals of the first and second flip-flops are the divided signals.

12. The phase-locked loop of claim 11, wherein the first and second divided signals differ in phase by a period of the clock signal.

13. The phase-locked-loop of claim 1, wherein said prescribed phase relationship corresponds to a predetermined phase difference.

14. The phase-locked-loop of claim 13, wherein said predetermined phase difference corresponds to one period of a voltage-controlled oscillator frequency.

15. A fractional-N frequency synthesizer for a mobile terminal, comprising:
a phase detector circuit that comprises,
a first phase detector having a first input port coupled to receive a reference signal, a second input port, a third input port and an output port, and
a second phase detector having a first input port coupled to receive the reference signal, a second input port, a third input port and an output port;
a loop filter having a first input port coupled to the output ports of the first and second phase detectors and an output port;
a voltage-controlled oscillator having an input port coupled to the output port of the loop filter and transmitting a prescribed frequency signal at an output port;
a programmable modulus divider having a first output port coupled to the second input port of the first phase detector to transmit a first divided signal, a second output port coupled to the second input port of the second phase detector to transmit a second divided signal, a first input port coupled to the output port of the voltage-controlled oscillator and a second input port; and
an accumulator having a first output port coupled to the second input port of the programmable modulus divider and a second output port coupled to the third input ports of the phase detectors.

16. The fractional-N frequency synthesizer of claim 15, wherein the mobile terminal is one of a cellular phone, a personal digital assistant, a digital audio player, an Internet appliance, a remote control device and a laptop computer.

17. The fractional-N frequency synthesizer of claim 15, further comprising a plurality of switches operated by a control line, wherein each of the switches couple a corresponding one of a plurality of charge pumps to the output port of a selected one of the first phase detector and the second phase detector according to a control signal from the accumulator.

18. The fractional-N frequency synthesizer of claim 15, wherein the first phase detector and the second phase detector are of the same design.

19. The fractional-N frequency synthesizer of claim 15, wherein the first phase detector comprises:
a phase detector portion with a first output port and a second output port; and
a charge pump portion having a plurality of charge pump stages.

20. The fractional-N frequency synthesizer of claim 19, wherein each of the charge pump stages comprises:
a first current source and a first switch coupled in series between a first prescribed voltage and a charge pump output terminal;
a second current source and a second switch coupled in series between a second prescribed voltage and the charge pump output terminal;
a first logic gate with a first input port coupled to the first output port of the phase detector portion, a second input that receives a control signal and an output port coupled to the first switch; and
a second logic gate with a first input coupled to the second output port of the phase detector portion, a second input that receives the control signal and an output port coupled to the second switch.

21. The fractional-N frequency synthesizer of claim 15, further comprising a signal delay device which delays an output from one of the first and second phase detectors.

22. The fractional-N frequency synthesizer of claim 15, further comprising a signal delay device coupled to one of the first and second phase detectors.

23. The fractional-N frequency synthesizer of claim 15, wherein the programmable modulus divider comprises:
a first logic gate;
a second logic gate that receives a control signal;
a first flip-flop coupled to receive an output signal of the first logic gate and a clock signal from the output port of the voltage-controlled oscillator;
a second flip-flop gate coupled to receive an output signal of the first flip-flop, wherein the first and second logic gates receive an output signal of the second flip-flop;
a third flip-flop coupled to receive an output signal from the second logic gate, wherein the first, second and third flip-flops receive the prescribed frequency signal as a clock signal, wherein an output signal of the third flip-flop is received by the first logic gate, and wherein the output signals of the first and second flip-flops are the divided signals.

24. The fractional-N frequency synthesizer of claim 15, wherein the first and second divided signals have the same frequency, and wherein the first and second divided signals differ in phase by the period of the prescribed frequency signal from the output port of the voltage-controlled oscillator.

25. A method for generating frequency signals, comprising:

(a) dividing a frequency signal output from an oscillator by a first value to produce a first divided signal;

(b) dividing a frequency signal output from an oscillator by a second value to produce a second divided signal;

(c) comparing the first divided signal to a reference signal to generate a first control signal;

(d) comparing the second divided signal to said reference signal to generate a second control signal; and (e) adjusting the oscillator based on the first control signal and second control signal.

26. The method of claim 25, further comprising:

selecting the first value and the second value so that the first divided signal and the second divided signal have a predetermined phase difference.

27. The method of claim 26, wherein said predetermined phase difference corresponds to one period of a voltage-controlled oscillator frequency.

28. The method of claim 25, wherein the first control signal reduces a frequency of the oscillator by a predetermined amount and the second control signal increases the frequency oscillator by a predetermined amount.

29. The method of claim 28, further comprising:

passing the first control signal and the second control signal through a loop filter, wherein the first control signal and the second control signal maintain a constant loop filter output voltage.

30. The method of claim 25, further comprising:

passing the first control signal and the second control signal through a loop filter, wherein the first control signal adds current to the loop filter and the second control signal discharges current from the loop filter, such that the first control signal and the second control signal maintain a constant loop filter output voltage.

31. The method of claim 25, further comprising:

enabling a first number of charge pumps connected to a first detector which performs step (c); and enabling a second number of charge pumps connected to a second detector which performs step (d), wherein the first number and the second number of enabled charge pumps are based on respective phase comparisons performed by the first detector and the second detector.

32. The method of claim 31, wherein the first number and the second number of enabled charge pumps are determined by a fractional accumulator state.

33. The method of claim 32, wherein the first number of charge pumps and the second number of charge pumps, when added, total a desired division factor of a frequency synthesizer.

34. The method of claim 25, further comprising:

delaying the first control signal relative to the second control signal by an amount sufficient to reduce perturbation in a voltage of a loop filter connected to the oscillator.

35. The method of claim 25, further comprising:

delaying the first divided signal and the reference signal prior to step (c); and comparing the second divided signal and the reference signal in step (d) without delay.

36. A phase-locked-loop, comprising:

an oscillator;

a divider which divides a frequency signal output from the oscillator by a first value to produce a first divided signal and by a second value to produce a second divided signal;

a first phase detector which compares the first divided signal to a reference signal to generate a first control signal for adjusting the oscillator; and a second phase detector which compares the second divided signal to said reference signal to generate a second control signal for adjusting the oscillator.

37. The phase-locked-loop of claim 36, wherein the first value and the second value generate a predetermined phase difference in the first divided signal and the second divided signal.

38. The phase-locked-loop of claim 37, wherein said predetermined phase difference corresponds to one period of the oscillator frequency.

39. The phase-locked-loop of claim 36, wherein the first control signal reduces a frequency of the oscillator by a predetermined amount and the second control signal increases the frequency oscillator by a predetermined amount.

40. The phase-locked-loop of claim 39, further comprising:

a loop circuit for receiving the first control signal and the second control signal, wherein the first control signal and the second control signal have values which maintain a constant loop filter output voltage.

41. The phase-locked-loop of claim 36, a loop circuit for receiving the first control signal and the second control signal, wherein the first control signal adds current to the loop filter and the second control signal discharges current from the loop filter, and wherein the first control signal and the second control signal have values which maintain a constant loop filter output voltage.

42. The phase-locked-loop of claim 36, further comprising:

a plurality of charge pumps connected to the first phase detector;

a plurality of charge pumps connected to the second phase detector;

an accumulator which generates signals for enabling predetermined ones of the charge pumps connected to the first phase detector and the second phase detector, wherein a total number of the enabled charge pumps is based on respective phase comparisons performed by the first detector and the second detector.

43. The phase-locked-loop of claim 42, wherein the total number of enabled charge pumps is determined by a fractional accumulator state.

44. The phase-locked-loop of claim 42, wherein the total number of enabled charge pumps corresponds a desired division factor of a frequency synthesizer incorporating the phase-locked-loop.

45. The phase-locked-loop of claim 36, further comprising:

a delay unit which delays the first control signal relative to the second control signal by an amount sufficient to reduce perturbation in a voltage of a loop filter connected to the oscillator.

46. The phase-locked-loop of claim 36, further comprising:

a delay unit which delays the first divided signal and the reference signal before being input into the first phase detector, wherein the second phase detector compares the second divided signal and the reference signal without delay.

* * * * *